United States Patent [19]

White et al.

[11] Patent Number: 4,600,597
[45] Date of Patent: Jul. 15, 1986

[54] METHOD AND DEVICE FOR DETERMINING THE CONTOUR OF SPIN-COATED THIN FILMS OF MATERIAL ON SUBSTRATE TOPOGRAPHY

[75] Inventors: Lawrence K. White, Princeton Junction; Nancy A. Miszkowski, Lawrenceville, both of N.J.

[73] Assignee: RCA Corporation, Princeton, N.J.

[21] Appl. No.: 666,191

[22] Filed: Oct. 29, 1984

[51] Int. Cl.$^4$ .............................................. B05D 3/12
[52] U.S. Cl. ........................................... 427/9; 427/82; 427/240; 427/282; 427/286; 428/409; 428/457; 428/688; 428/901
[58] Field of Search ................... 427/9, 240, 286, 282, 427/82; D19/40; 428/409, 901, 688, 457

[56] References Cited

U.S. PATENT DOCUMENTS 4,515,828  5/1985  Economy ........................... 427/240

OTHER PUBLICATIONS

The American Heritage Dictionary, Houghton Mifflin Co., Boston, 1976, p. 1262.
D. W. Widmann & H. Binder, "Linewidth Variations in Photoresist Patterns on Profiled Surfaces," IEEE Trans. Electron Devices, vol. ED-22, No. 7, pp. 467–471 (Jul. 1975).
M. M. O'Toole, E. D. Liu & M. S. Chang, "Linewidth Control in Projection Lithography Using a Multilayer Resist Process," IEEE Trans. Electron Devices, vol. ED-28, No. 11, pp. 1405–1410 (Nov. 1981).
A. C. Adams & C. D. Capio, "Planarization of Phosphorus-Doped Silicon Dioxide," J. Electrochem. Soc., vol. 128, No. 2, pp. 423–429 (1981).
R. C. Singleton, "An Algorithm for Computing the Mixed Radix Fast Fourier Transform," IEEE Trans. Audio and Electroacoustics, vol. AU-17, No. 2, pp. 93–100 (Jun. 1969).

Primary Examiner—Norman Morgenstern
Assistant Examiner—Janyce A. Bell
Attorney, Agent, or Firm—Birgit E. Morris; Donald S. Cohen

[57] ABSTRACT

A method for determining the contour of a spin-coated thin film of material, such as a photoresist solution, on an uneven topography, such as a patterned semiconductor wafer, utilizes a pattern of features as isolated, raised lines of different widths. The pattern serves to provide frequency weighted parameters used to estimate the coating conformality on both simple and complex topographies. One parameter indicating the contour is independent of coating thickness and the other parameter suggests the range of feature-to-feature interaction inherent in complex topographies. The pattern is useful as a "knock-out" portion of a product wafer to monitor the contour of the coating deposited by spun-coated process steps.

Orienting the line pattern in radial and tangential position reveals coating thickness relationships dependent on feature orientation with respect to the centrifugal center of the substrate.

12 Claims, 11 Drawing Figures

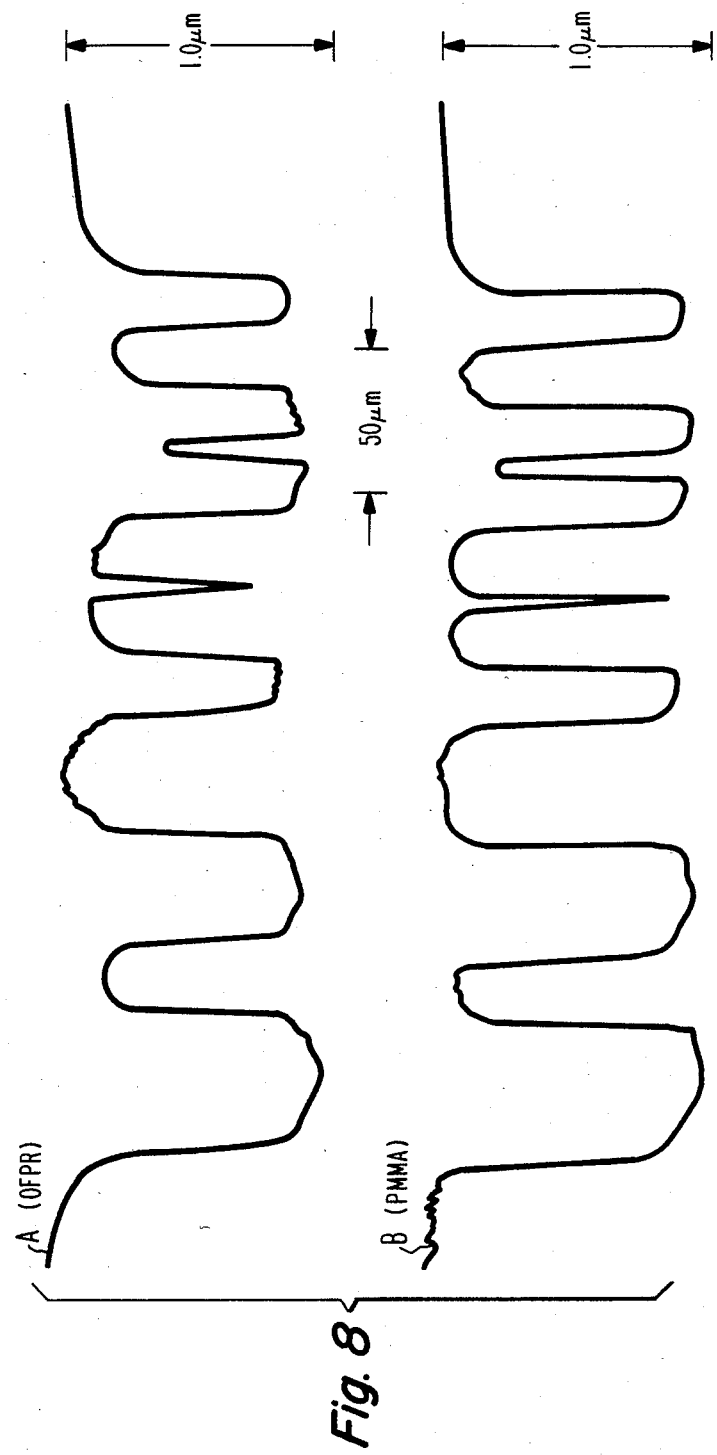

METHOD AND DEVICE FOR DETERMINING THE CONTOUR OF SPIN-COATED THIN FILMS OF MATERIAL ON SUBSTRATE TOPOGRAPHY

This invention relates to a method for determining the contour of spin-coated thin films of material on topography of substrates used in semiconductor processing.

BACKGROUND OF THE INVENTION

More detailed understandings of the spun-on planarization properties of thin films are becoming increasingly important in the field of integrated circuit processing. See articles in this field, for example, by D. W. Widmann and H. Binder, entitled "Linewidth Variations in Photoresist Patterns on Profiled Surfaces," *IEEE Trans. Electron Devices*, Vol. ED-22, No. 7, pp. 467-471 (July 1975 and M. M. O'Toole, E. D. Liu and M. S. Chang, entitled "Linewidth Control in Projection Lithography Using a Multilayer Resist Process," *IEEE Trans. Electron Devices*, Vol. ED-28, No. 11, pp. 1405-1410 (November 1981). The property of planarization is the ability of a material applied to a surface by a spinning action of the substrate, receiving the material from a nozzle, moving radially thereover to cover the topography of the surface and reduce step heights. It has recently been discovered that the patterned dimensions of a film of resist that is deposited on uneven topographical features are strongly influencesd by the change in the thickness of the resist. Moreover, in the etching of the photoresist material to develop a pattern by a process which has been known as the dual-etch-back technique, the conformality of the passivation and isolation layers that are to be etched depend strongly on the spun-on, thin film planarization properties. See the article in this field by A. C. Adams and C. D. Capio, entitled "Planarization of Phosphorus-Doped Silicon Dioxide," *J. Electrochem. Soc.*, Vol. 128, No. 2, pp. 423-429 (1981).

One of the most complex aspects of the phenomenon of planarization is the effect it has on the adjacent and surrounding topography. Mere changes in the position and size of a topographical feature can change the thickness of the film on adjacent features. The term "complex topography" for the present purposes is used to identify features that are so close to each other as to manifest interactive effects between them during the spin-coating process. The coating thickness can be increased or decreased because of this effect. It is very difficult to predict these effects before they are experimentally observed. It is also difficult to determine the polymer planarization properties from basic rheological principles.

The principle of the present invention to predict the planarization effects on the contour of a spun-coating over complex topography is based on a semi-empirical approach to first characterize the planarization properties on relatively simple topography wherein interactive effects are minimal and use such results to predict planarization phenomena on more complex topography where interactive effects are significant.

The present invention utilizes Fourier transform relationships to convert topographical features of semiconductor device patterns between the spatial domain and the frequency domain. The frequency components of the Fourier transform are weighted to provide an indication of the topographical features after they have been spun-coated as a thin film. The planarization properties of the thin film are characterized by two adjustable parameters, as will be explained in detail hereinafter. A typical spun-on thin film, in the preferred embodiment of the invention, is formed of photoresist material.

SUMMARY OF THE INVENTION

The contour of a spin-coated thin film of material is determined by forming a simple topography in the form of a plurality of raised, isolated, parallel lines on a flat portion of the surface of a substrate. The heights of all of the lines, as deviations from the flat surface, are measured and thereafter spin-coated with a film of a viscous material. The step heights are measured at the respective lines. The step height data is used to determine the planarization contour of spin-coated film.

According to one feature of the invention, the thickness of the spun-on coating is measured relative to the flat expanse to determine the conformality contour of the film over the raised line topography.

According to other features of the invention, orienting the lines to be either radial or tangential to the center of the substrate provides additional information of the contour of the film as it relates to the centrifugal center of the spinning substrate.

BRIEF DESCRIPTION OF THE DRAWING

FIGS. 7A, 7B, 7C and 8 are plots of traces of simulated and actual experimental profilometer measurements on complex topography.

DETAILED DESCRIPTION OF THE PREFERRED EMBODIMENT OF THE INVENTION

As indicated hereinabove, the present invention is based on a relationship derived from the expression of the topographical features of a semiconductor device pattern in the frequency domain as a Fourier transform. An analysis of the Fourier transform provides the basis for developing a test pattern as a model of simple topography formed on a semiconductor surface to simulate a wide range of complex topography that is utilized in semiconductor wafer processing. As the need for smaller and smaller sizes of semiconductor device technology is demanded, the need for determining the properties of spun-on coatings on surface topography is increasingly more important to improve the yield of such devices. The small dimensions of interest are those in which the step height of the topographical features are about the same dimensions as the line widths.

Figure 1:
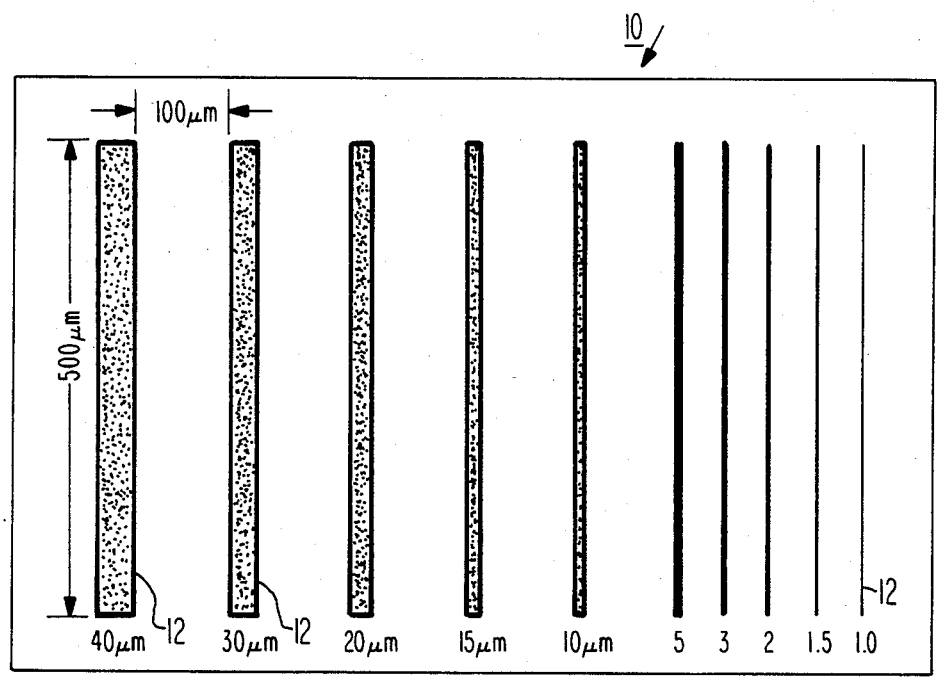
FIG. 1 is a schematic of a photolithographic mask used in the practice of the invention.

The invention is practiced with the use of a mask, such as mask 10 shown in FIG. 1. The mask 10 is formed using conventional mask making techniques with a plurality of isolated lines 12 spaced apart by a dimension of about 100 μm and having an overall length of at least 200 μm, but typically at about 500 μm. The width of each of the isolated lines 12 is selected from within the range of 1 to 100 μm. However, each line width is different. In the preferred form of the mask 10, the dimensions of the widths of the lines 12 are 40, 30, 20, 15, 10, 5, 3, 2, 1.5 and 1 μm, as shown in FIG. 1.

Figure 2:
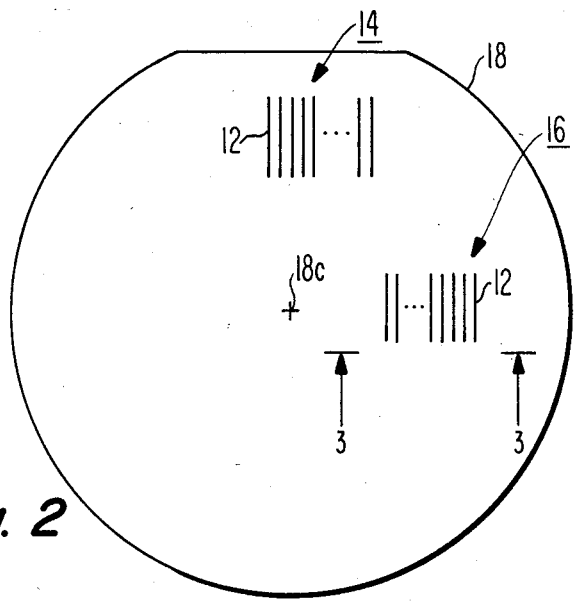
FIG. 2 is a schematic of a semiconductor wafer provided with an etched pattern developed from the mask shown in FIG. 1.
Figure 3:
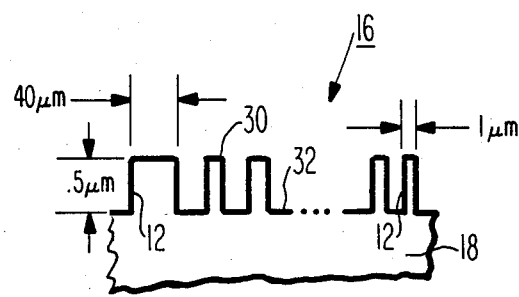
FIG. 3 is a elevation view of FIG. 2 as seen along viewing line 3—3.

As shown in FIG. 2, the lines 12 collectively form either a pattern 14 or a pattern 16 as structural topographical features developed on a wafer 18 of silicon. The pattern 14 is oriented such that its lines 12 extend generally radially relative to the centrifugal center 18c of the wafer 18. However, the pattern 16 is oriented such that its lines 12 are tangential to the centrifugal center 18c. Patterns 14 and 16 are formed of thermal oxide using a positive resist and anisotropic plasma etching procedure. The isolated lines 12 each have a pattern height of about 0.5 μm. An elevated view of the pattern 14 is shown in FIG. 3. Except for the patterns 14 and 16, the wafer 18 is substantially flat and, accordingly, the step height of the lines 12 is measured relative to the flat expanse portions of the wafer 18. The step heights of each of the lines 12 were measured with a Tencor Alpha Step Profilometer. The line widths of the respective lines 12 were measured with a filar eyepiece of a microscope.

The patterns 14 and 16 are herein termed "simple" topography since the spacing between the respective adjacent lines 12 are so great as to obviate interactive coating effects. Interaction between closely spaced features causes the coating thickness on each to change. When such interactive effects occur, as mentioned above, we shall term such topography as being "complex."

In another embodiment of the invention, the patterns 14 and 16 may be on test chips, sometimes known as "knock-outs," on a product wafer. The knock-out patterns in such form can serve as a monitor for coating steps in the processing of the product wafer.

Following the development of the structural features of patterns 14 and 16 on the wafer 18, a film of a viscous material, such as a positive resist, is spin-coated on the flat surface of the wafer 18 as well as on the patterns 14 and 16. Typically, the spun-on, thin-film coating thickness ranges in value from one to two times that of the step height of the lines 12. Several different types of photoresist materials were used for each of several different coating experiments. Of those types, two will be illustrated for this description. One was an OFPR 800 (viscosity of 30 cps) positive resist with 27% solids available from Dynachem Corp., Santa Anna, Calif., and the other was a PMMA (496k) polymethylmethacrylate with 9% solids (viscosity 90 cps) available from KTI Chemicals, Inc., Sunnyvale, Calif. These two particular photoresist solutions were selected for this description because of their substantially different planarization properties and their resistance to thermal flow during the curing periods needed to harden the film sufficiently for profilometric analysis.

Figure 4:
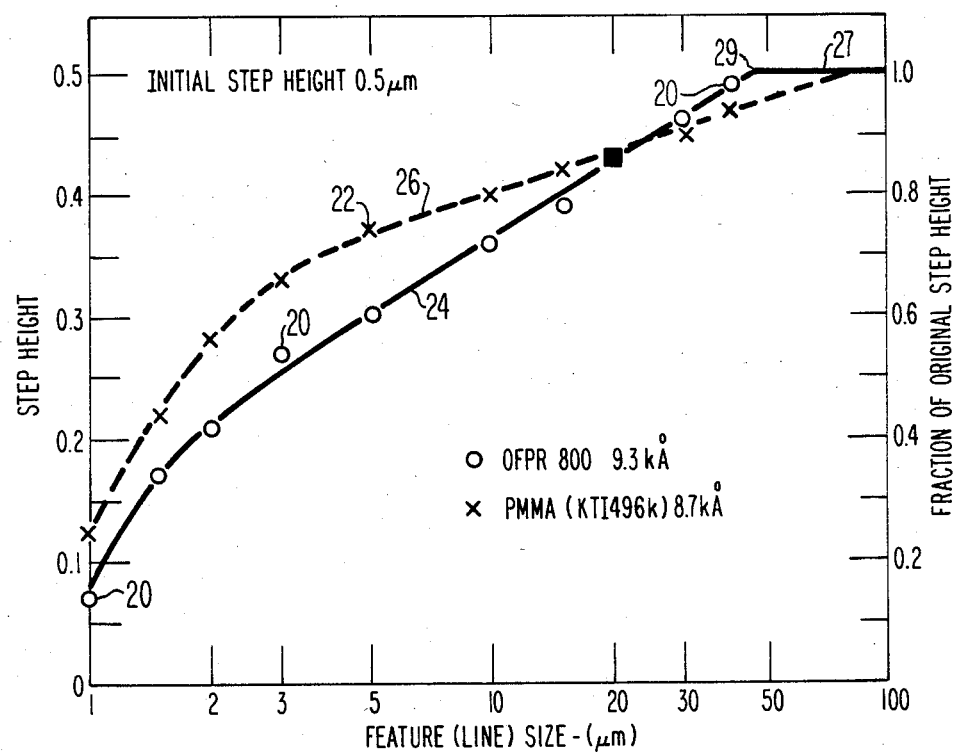
FIG. 4 is a plot of the step heights of the individual lines of the pattern shown in FIGS. 2 and 3 after coating each with several different kinds of photoresist materials as a function of the size of the isolated line sizes in the range of 1 to 100 $\mu$m.

The coatings were measured using the Tencor Profilometer operating at a 15 milligram tracking force on the 10kA scale. A stylus radius of 3 μm was used to minimize the effects of the stylus tracking on the recorded profilometer trace. The accuracy of the measurements was on the order of ±100 Å (Angstroms). Several readings were made across the entire surface of the wafer 18 to assure the accuracy of the step height measurements. A plot of step height data points 20 and 22, as shown in FIG. 4, was made for each of the respective coatings on the lines 12. The step height (left-side ordinate legend) for each line 12 was plotted against the respective line widths in a logarithm scale at which the step height was measured. The right-side ordinate legend of FIG. 4 indicates, for convenience, the fraction of the original step height. The step height, in fraction form, is more readily related to the weighting factors ($W_n$), to be described.

In FIG. 4, the data points 20 for the OFPR resist are indicated by circles and the data points 22 for the photoresist PMMA are indicated by x's. Each data point (20 or 22) was measured at the respective raised lines 12 of the pattern 14. A fitted line 24 for data points 20 reveals a relatively straight section within the line width range of about 2 to 50 μm. A fitted line 26 connecting the data points 22 shows a relatively straight portion within the range of 5 μm extrapolated to over 50 μm.

The plot of the two photoresist materials and the effect on the coating on the line patterns 14 and 16 indicates the strong dependence of the feature size of the topography has on coating contour phenomenon. In this particular case, the feature size is the width of the lines 12. The variation in step height for the line width, as seen in FIG. 4, is clear. Thus, as the line width increases, the step height of the spun-on coating increases, and vice versa. Thus, there is a wide range of feature sizes (line widths) wherein there is a linear correlation between the logarithms of the feature size (line width) and the degree of contour (step height variation). It is this coating contour property dependent on the feature size that is the basis for our discovery that the periods or frequency components inherent in the topography contribute to the observed contour phenomenon.

For the purposes of the present invention and description thereof, the "contour" of the surface of the spun-on coating represents the deviation from a flat coating. Deviations from the flatness of the coating can be represented as roughness, sometimes measured in terms of peak-to-peak deviations. For this description, we shall use step height measurements to be representative of the contour deviations. When the spun-on coating is used, as in some photoresist process steps, to cover completely the topography, the contour of the coating is a manifestation of the planarization property of the photoresist material. However, when the spun-on coating is used to conform to the topography, as done for some photoresist and dielectric coating process steps, the coating is desirably of uniform thickness. The contour of such a coating is a manifestation of what we shall term herein the "conformality" of the coating. Nevertheless, in a generic sense, the invention determines the contour of the coating. Small deviations in step heights are typically desired for planarization applications, while large step heights are desired for conformality applications. It should be understood that the property of contour, according to this invention, is derived from the step height and width of the various features, such as raised lines 12. Nevertheless, this limitation does not adversely affect the benefits of the invention. Indeed, the contour property of a film in terms of its conformality also describes, to some degree, how the sidewalls and corners of steps are coated.

The principle of the present invention, as mentioned above, is based on the mathematical model of a simple topography in the form of isolated lines which, as a first order approximation, can be used to analyze what can be said to be individual "frequency" components of the topography. Such a topography, when coated with a spun-on film, can be used to characterize a "low-pass frequency filter" for that film. Each of the isolated line patterns 14 or 16 (FIG. 3) in cross-section is a series of rectangles or squares. The "square" is readily useful in wave form analysis in the frequency domain and can be analyzed into a plurality of sine and cosine wave components. It should be appreciated that there is a spatial to frequency domain transform which can be used to define the contour of the coating on the topography. The contour of the coating film on the steps of the raised line pattern topography can be determined by expressing the line topography as a series of sine and cosine functions in a Fourier transform and weighting these functions according to their periods (i.e., the reciprocal of the frequencies) to express the contour of the spin-coated topography. Since the raised line pattern of the topography can be described by a piecewise continuous function, the same topography can be described with a series of sine and cosine functions as expressed by the following equation:

$$T(y) = \sum_{n=0}^{j} a_n \cos \frac{2\pi n y}{N} + b_n \sin \frac{2\pi n y}{N} \quad (1)$$

where $T(y)$ is the topography of the uncoated surface which is represented by an even number of evenly spaced points N, where $a_n$ and $b_n$ are the amplitude coefficients of the respective frequency components, and where $j=N/2$. N is in the present embodiment 1024 and j is 512. See the article by R. C. Singleton, entitled "An Algorithm for Computing the Mixed Radix Fast Fourier Transform," *IEEE Trans. Audio and Electroacoustics*, Vol. AU-17, No. 2, pp. 93–100 (June 1969), for a method of calculating the coefficients $a_n$ and $b_n$.

When a spun-on coating of a viscous material, such as the photoresist OFPR or PMMA, is applied to conform to the topography represented by equation (1), a smoothed conforming topography of the coating results, expressed herein as $T_s(y)$. An approximation of the smoothed topography is obtained by weighting the amplitude coefficients $a_n$ and $b_n$ of equation (1) with a weighting factor ($W_n$) as follows:

$$T_s(y) \approx \sum_{n=0}^{j} a_n w_n \cos \frac{2\pi n y}{N} + b_n w_n \sin \frac{2\pi n y}{N} \quad (2)$$

where $T_s(y)$ is the smoothed topography resulting from the film spun-deposited over the surface including the lines 12, ($W_n$) is a weighting factor related to the height of the lines 12 of the topography, wherein $1.0 > W_n > 0.0$ and $W_{n+1} \geq W_n$. The weighting factors ($W_n$) represent, it can be said, the amount of coating that is contributed by each frequency component to the step height for each respective line width. This effect is suggested from the experimental data plot of FIG. 4. FIG. 4, it should be noted, is a plot of measurements in the spatial domain of the spun-coated, raised lines 12. The weighting factors ($W_n$) themselves in the frequency domain cannot be obtained directly from the spatial domain plot of FIG. 4. We have observed that the weighting factors ($W_n$) are related in the frequency domain to a multiple of the logarithm of the feature size (line width), which is termed herein the "period." A plot of that simulated relationship is shown in FIG. 5.

Figure 5:
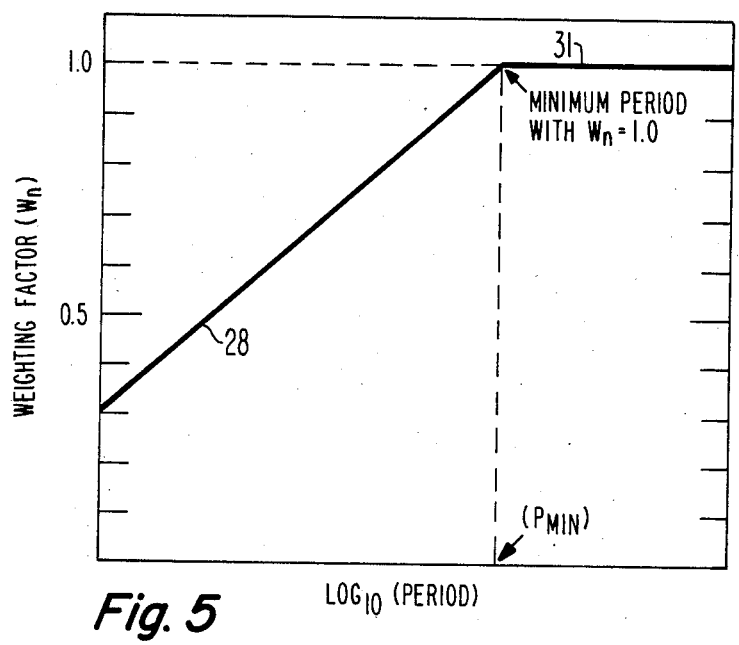
FIG. 5 is a plot of the weighting factors ($W_n$) as a function of the logarithm of the line pattern of the developed mask on the substrate shown in FIG. 2.

In FIG. 5, the abscissa represents the logarithm of about three or four times the line widths and the ordinate represents the weighting factors ($W_n$). The plot is applicable to any topographic configuration. In the present embodiment, the minimum period, wherein $W_n$ is 1.0, occurs at about a line width of 40 μm. A line 28 was found by experimentation to define the linear relationship of the logarithm of the period (line width) and the weighting factors ($W_n$). The line 28 defines what we term a "low-pass frequency filter," as will be explained in further detail. The change in the weighting factors ($W_n$) with respect to the logarithm of the period can be represented by two adjustable parameters which are termed herein as $P_{min}$ and a. The parameter $P_{min}$ is the minimum period for which the weighting factor ($W_n$) is equal to one. The minimum period ($P_{min}$) is typically three to four times the minimum line width approximated by the intercept 29 of the plot of the conformality curve 24 with the initial step height indicated by horizontal line 27 (FIG. 4).

The slope of line 28 is represented by the parameter a. The slope of line 28 is an indication of the conformality property of the spun-coated film contour over the line topography (14 or 16, FIGS. 2, 3). The smaller the slope, the more superior the conforming properties. The conformality of the line pattern (14 or 16) is related to the thickness of the coating both on the upper surfaces 30 of the raised lines 12 and on the flat portion 32 as shown in FIG. 3. $P_{min}$ represents the minimum spacing between lines for which no interaction effects of the coating occurs. Thus, if the spacing between features is less than $P_{min}$, the conformality of the coating may be influenced by mutual coating interaction whereby the step height or adjacent features may be decreased or increased. A perfect or ideal conformable coating would be one of uniform thickness both on the raised lines 12 and on the flats 32 and have a contour that, accordingly, conforms to the topography. A perfect or ideal conformal coating in the frequency domain is represented by the horizontal line 31 in FIG. 5. This perfect coating would be manifested by a spatial line 24 or 26 of the experimental data of FIG. 4 that would be horizontal rather than with the respective slopes shown.

According to the principal embodiment of the method of this invention, approximate contour of any spun-coating material on any topography can be provided by developing first a simple line pattern, such as pattern 14 or 16, on a flat substrate 18. The uncoated step heights are measured. A material of any viscosity is spun-coated thereon. The step heights of the coating are measured. A plot of the measured step height data similar to curves 24 or 26 of FIG. 4 is made. A fitted line is extended to provide an intercept 29 to the initial step height abscissa indicated by line 27. The intercept 29 defines a line width that is approximately ⅓ to ¼ the minimum period ($P_{min}$) defined in the frequency domain (shown in FIG. 5). The slope and intercept 29 of this experimental data is used as a first approximation to define a low-pass frequency filter given by the $P_{min}$ and a parameters, similar to line 27 in FIG. 5, from which the values of $W_n$ are calculated. $P_{min}$ and a are selected to provide a good fit of the experimental step height data using well-known iterative techniques.

Examples of experimental fits to step height data are shown hereinafter in Table 1 to be described further. The $P_{min}$ and a define the low-pass frequency filter (i.e., the values of $W_n$) that weight the $a_n$ and $b_n$ coefficients in equation (2). The values of $W_n$ that correspond to the periods in each raised line 12, when applied to equation (2), provide the topography $T_s(y)$ in numerical form. The numerical values of the topography $T_s(y)$ can then be used in any suitable form such as a computer tracing to picture the profile of the contour or simply as tabulated data as information to evaluate the contour of the coating to the line pattern.

Figure 6:
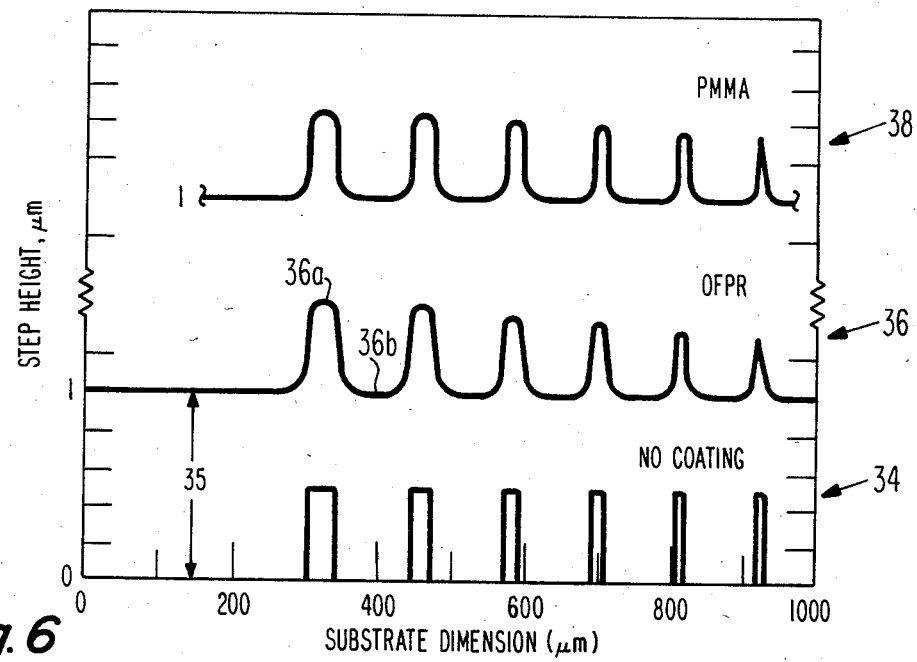
FIG. 6 is a plot of step height as a function of the dimension of a substrate based on simulated planarization properties for complex topography.

An example of a pictorial display derived from a computer tracing of an isolated line topography is shown in FIG. 6 developed from a set of values determined from a solution of equation (2). FIG. 6 is a plot of the profile of the step heights in micrometers developed from simulations of a model similar to that hereinabove described concerning equations (1) and (2) for isolated line features similar to pattern 14 of FIG. 2 before the spin-coating step, as shown by the topography profile 34. The step height changes after the OFPR resist spun-coated films are shown by coating profile 36 and the results of the coating by the resist coating PMMA are shown by coating profile 38. The profile 38 is started at a step height of 1 μm but is spaced from profile 36 to avoid an overlap in FIG. 6 of the two profiles. The original step height for the topography on which the films were spun-coated is 0.5 μm.

In order to determine the conformality of the coating contour with respect to the topography over which the coating is applied, the thickness of the coating over the flat expanse portion of the substrate is measured. This thickness value, together with the coating contour, is used to predict how a particular spun-on coating will conform to the uncoated topography. Thus, as shown in FIG. 6, the measured thickness of the coating is dimension 35. The coating defining profile 36 is actually 0.83 μm thick. This thickness value is used to determine the relative position and thickness of the contour of the profile 36 over the topography of profile 34. The computer display will accordingly show the conformality of the profile 36 relative to the uncoated topography profile 34.

It will now be appreciated by those skilled in the art that the weighting procedure of this invention using the weighting factors ($W_n$), serves to dampen the high frequency components embodied as small period (line width) components on the surface of the line topography. Typically, the line widths in the range of 1.0 to about 10 μm are dampened with respect to the components of larger line widths, such as those of line widths of 10 μm and larger. This results in approximating the contour as a function of the feature size, that is, for this embodiment, the width of the lines 12. Thus, there is a smoothing of the sharp corners of the lines 12, as at the peak 36a, and a build-up of the bottom of the line steps, as at the valley 36b, as shown in FIG. 6.

The planarization information provided is the contour of the film profile. Adding to the planarization contour information, the thickness of the film over the pattern provides, in addition, the more detailed property of the conformality. The conformality information is used to predict how a particular spun-coated material will conform to a particular topography. By using the simple line topography, it is understood, as explained above, no interactive effects occur because the line features are widely spaced.

The following Table provides a summary of experimental and simulated step heights for two different photoresist solutions on a simple raised line pattern similar to pattern 14 of FIG. 2. The simulated results are similar to profiles 34 and 36 for the OFPR film and profiles 34 and 38 for the PMMA film as shown in FIG. 6.

TABLE 1

MEASURED (EXPERIMENTAL) AND SIMULATED STEP HEIGHTS IN MICROMETERS FOR ISOLATED LINES

| Feature Size μm (line width) μm | PMMA RESIST | | OFPR 800 RESIST | |
|---|---|---|---|---|
| | Experimental | *Simulated | Experimental | **Simulated |
| 40 | 0.47 | 0.465 | 0.48 | 0.478 |
| 30 | 0.45 | 0.450 | 0.45 | 0.455 |
| 20 | 0.43 | 0.431 | 0.42 | 0.417 |
| 15 | 0.42 | 0.416 | 0.38 | 0.386 |
| 10 | 0.40 | 0.393 | 0.35 | 0.343 |
| 5 | 0.37 | 0.364 | 0.30 | 0.294 |

*For: a = 0.28 and $P_{min}$ = 300 μm
**For: a = 0.60 and $P_{min}$ = 165 μm

The good correlation of the finally determined simulated values to the experimental data is evident from the values shown in Table 1.

The invention described thus far provides a method for describing the coating contour of a simple topography pattern (14, 16, FIG. 2), such as a series of spaced, raised lines 12 by which no interaction occurs. The invention can be used to determine the contour of the coating solution to more complex topography of the type expected to be used for forming an integrated circuit (IC) by which interaction effects typically do occur. For a selected complex topography, the Fourier transform similar to equation (2) is devised. The weighting factors ($W_n$), determined from the simple topography pattern (14 or 16) for a particular spun-coated material, as explained hereinabove, are introduced into the Fourier transform for the selected complex topography. The solution of the substitution values in that Fourier transform provides a simulated smoothed topography $T_s(y)$. This solution can be portrayed in a profile similar to profile 36 of FIG. 6. It should be understood that such a profile is in two-dimensional form. To represent the pattern in three-dimensional form, an equation along the third axis is devised and analyzed in a similar manner, as will now be apparent to those skilled in this art.

Figure 7A:
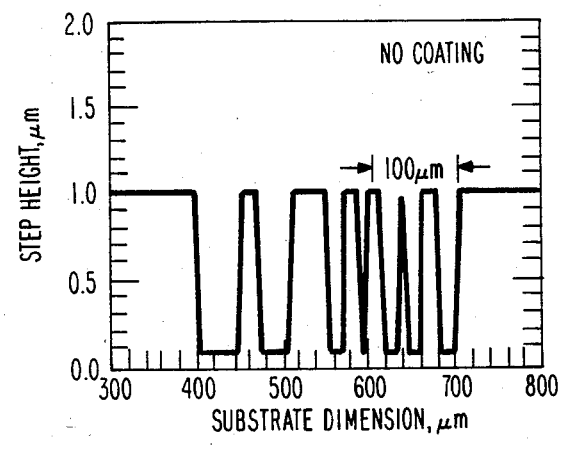
Figure 7B:
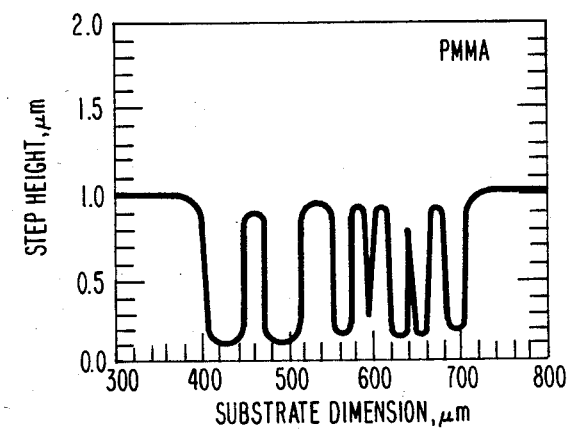
Figure 7C:
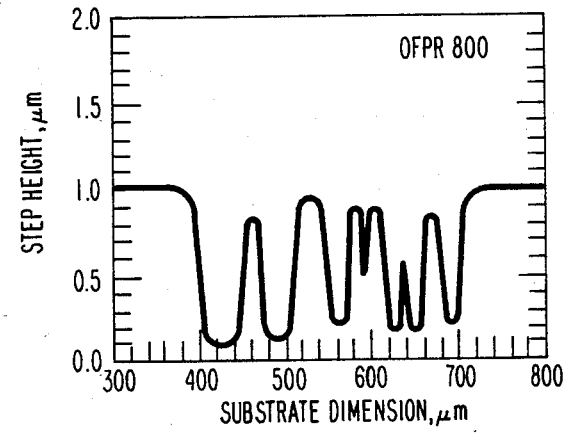

An example of a somewhat complex pattern in two-dimensional form will now be described. FIGS. 7A, 7B and 7C show a simulation of a somewhat complex topography of a grating formed of lines 10 μm wide with 10 μm spacing between lines. Such close spacing causes interactive effects, wherein the spacing is less than the value for $P_{min}$, as described for the simple line pattern 14 or 16. FIG. 7A is the profile of the raised features prior to being spun-coated. The $P_{min}$ values for the respective PMMA and OFPR solutions are 145 μm and 270 μm for the simulated coatings shown in FIGS. 7B and 7C, respectively.

The corresponding experimental profilometer planarization curves are shown in FIG. 8. The shapes and trends of the simulated curves of FIG. 7B and 7C closely correlate with the experimental curves B and A, respectively, of FIG. 8.

Figure 9:
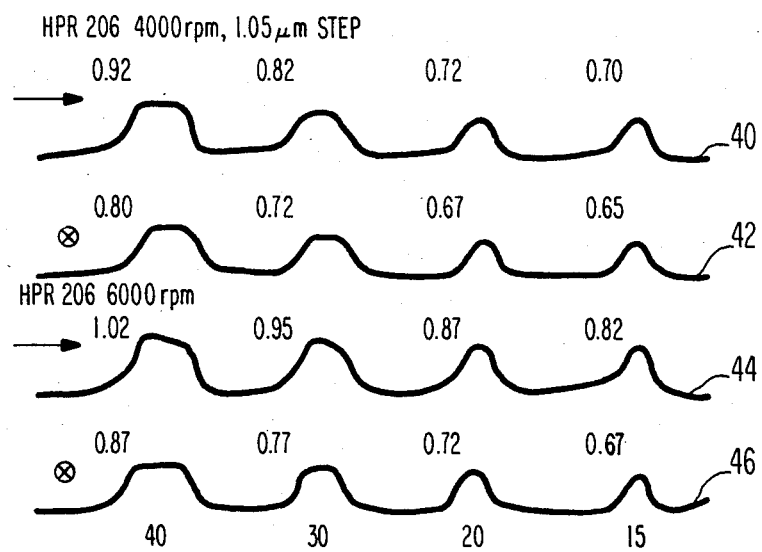
FIG. 9 shows profilometer traces of steps from the pattern described in FIGS. 2 and 3 that are oriented radially and tangentially with respect to the wafer center.

As mentioned above, the patterns 14 and 16 shown in FIG. 2 are respectively oriented radially and tangentially with respect to the centrifugal center of the wafer 18. The orientation of the features in the topography can influence the thickness variations of the spun-on coating. FIG. 9 shows the profilometer traces of isolated lines with features of 40, 30, 20, 15 and 10 μm in width which were deposited with resist respectively at 4,000 and 6,000 rpm spin speeds. Trace 40 is for a resist HPR 206 at 4,000 rpm in which a 1.05 μm step height was deposited with the photoresist with an orientation, such as pattern 14 in FIG. 2. The curve trace 42 is for a similar deposition in which the pattern was tangential to the center, as represented by pattern 16 of FIG. 2. Traces 44 and 46 represent the results of a profilometer measurement for the same photoresist deposited at 6,000 rpm. The numbers above the respective traces indicate the maximum measured height and the number below the traces indicate the feature size, that is, the width of the respective lines 12. The arrows on the traces indicate the directions from the wafer center 18c for the tangential orientation and the circled x for the radial orientation. It is seen that, in addition to the increased step heights for the tangential orientations, the photoresist film also tends to build up on the sidewall of the stepped line and produces an asymmetrical shape for the line feature. Both of these particular photoresists show reduced orientation effects at the lower spin speed of 4,000 rpm. It should be understood that the orientation effect is more complex than that depicted by the orientations illustrated in FIG. 2 and experimentally measured as illustrated by FIG. 9.

In practice, the topography of the actual integrated circuit devices are much more complicated. Nevertheless, according to the principles of the present invention, a reasonable indication of the effects of the complex topography can be estimated from the pattern (10 of FIG. 1) used in the development of the spaced line patterns 14 and 16.

While the mask 10 used in the preferred form of the invention utilizes line widths selected from within the range of 1 to 40 μm and line spacing of 100 μm, other line widths and spacing may be used depending on the weighting factors ($W_n$) desired. Moreover, while the essential range of line widths used to define the preferred form of low-pass frequency filter is 10 to 40 μm, the method provides, in many cases a good indicator of the contour of the coating on feature sizes smaller than 10 μm. For example, the expected contour of a coating on a 1 μm feature size can be predicted from the 10 to 40 μm feature size step height data only by extrapolating the low-pass frequency filter (FIG. 5) in a linear fashion according to the logarithm of the period into periods that represent feature sizes less than 10 μm. Of course, by using step height data that includes 1 μm features, more accurate predictions can be made, particularly, for complex topography.

What is claimed is:

1. A method for determining the contour of a spin-coated thin film of material on a substrate topography comprising the steps of:
   (a) providing a plurality of parallel, isolated, raised lines of differing widths on a portion of the surface of a flat substrate;
   (b) measuring the step height of the raised lines as deviations from another flat surface portion of said substrate;
   (c) spin-coating a film of a viscous material on the surface of the substrate including said raised lines and said another flat surface portion, said film thereby defining a pattern;
   (d) measuring at one or more locations of said pattern the change in step higher manifested by said film over said raised lines at each of said one or more locations to provide a plurality of height data points corresponding to said raised lines;
   (e) calculating the amplitude frequency component coefficients ($a_n$ and $b_n$) of a Fourier integral series in the frequency domain representing said pattern; and
   (f) determining a low pass frequency filter that fits the change in step heights measured in step (d), said filter reducing the calculated amplitude of said frequency component coefficients determined by step (e);
   (g) said frequency filter providing information which can be used to calculate a predicted contour of a spin-coated film of said viscous material on said substrate topography, said predicted film contour being in the form of numerical data or a pictorial display.

2. The method of claim 1 further comprising the step of meauring the thickness of said film whereby the conformality contour of said film over said raised line topography is determined.

3. The method of claim 1 wherein said low pass frequency filter of step (f) is determined by plotting data points corresponding to said measured step heights of said film as a function of the logarithm of said line widths to determine a linear fit of data points, the slope of said linear fit being an approximation of said slope (a), and the intersection of said linear fit with the initial step height of said raised lines as measured by step (b), being said intercept ($P_{min}$).

4. The method of claim 1 wherein said Fourier transform series is expressed in a general form as $$T_s(y) \approx \sum_{n=0}^{j} a_n w_n \cos \frac{2\pi ny}{N} + b_n w_n \sin \frac{2\pi ny}{N}$$

where $T_s(y)$ is the smoothed topography resulting from said film spun deposited over said surface including said raised lines, $a_n$ and $b_n$ are the amplitude coefficients of the frequency components, $j = N/2$, N is an even integer that is at least two times the spacing between the raised lines, and $W_n$ is a weighting factor related to the height of the raised lines of the topography, wherein $1.0 > W_n > 0.0$ and $W_{n+1} \geq W_n$.

5. The method of claim 4 for predicting the contour of said film of viscous material on a complex topography in which the raised lines are so closely spaced as to cause interactive coating effects, said topography being expressed as a Fourier transform of the form given in claim 4, further comprising the steps of calculating the values of $T_s(y)$ by substituting said values of $W_n$ in said complex topography transform, the values of $T_s(y)$ being an indication of conformality of said solution to said complex topography.

6. The method of claim 1 further comprising the step of orienting said plurality of raised lines to be generally radial with respect to the centrifugal center of said substrate.

7. The method of claim 1 further comprising the step of orienting said plurality of raised lines to be generally tangential with respect to the centrifugal center of said substrate.

8. The method of claim 1 wherein said lines have values of width lying in the range of about 10 to 40 μm.

9. The method of claim 1 wherein said lines have values of width lying in the range of about 1 to 100 μm.

10. A method for determining the contour of a spin-coated thin film of material on a substrate topography comprising the steps of:
   determining experimentally the change in step height of a given pattern covered with a spin-coated film of viscous material; said pattern having features of a given width and spacing that do not cause interaction effects when spin-coated with said material;
   determining the low-pass frequency filter for the Fourier coefficients that correspond to the measured step heights, said frequency filter including weighting coefficients for each topographical feature, whereby said weighting coefficients are used to determine the contour of any viscous material on any topography that can be represented by a Fourier transform.

11. A monitor of the contour of spin-coated material comprising:
   a wafer having a flat surface including topography embodying an integrated circuit pattern on said surface, said pattern being represented by a Fourier transform,
   a test pattern of known topography formed on a flat surface portion of said wafer remote from said integrated circuit pattern, for monitoring the contour of viscous material spun on said integrated circuit topography, said test pattern topography comprising a pattern of a plurality of parallel, isolated, raised lines of differing widths having values lying in the range of about 1 to 100 μm.

12. The monitor of claim 11 wherein the width of said lines have values in the range of about 10 to 40 μm.

* * * * *

UNITED STATES PATENT AND TRADEMARK OFFICE
CERTIFICATE OF CORRECTION

PATENT NO. : 4,600,597

DATED : July 15, 1986

INVENTOR(S) : Lawrence Keith White et al.

It is certified that error appears in the above-identified patent and that said Letters Patent is hereby corrected as shown below:

Column 1, line 19, ")" should be after 1975.

Column 1, line 30, "influencesd" should be --influenced--.

Column 6, line 21, "a" should be --$\underline{a}$--.

Column 6, line 28, "a" should be --$\underline{a}$--.

Column 6, line 67, "a" should be --$\underline{a}$--.

Column 6, line 68, "a" should be --$\underline{a}$--.

Column 7, line 5, "a" should be --$\underline{a}$--.

Column 10, line 6, "higher" should be --height--.

Column 10, line 26, "meauring" should be --measuring--.

Signed and Sealed this

Twenty-third Day of September 1986

[SEAL]

Attest:

DONALD J. QUIGG

Attesting Officer

Commissioner of Patents and Trademarks